(12) United States Patent
Echigoya

(10) Patent No.: US 6,215,173 B1
(45) Date of Patent: Apr. 10, 2001

(54) REDUNDANCY FUSE BLOCK HAVING A SMALL OCCUPIED AREA

(75) Inventor: Kenichi Echigoya, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/438,950

(22) Filed: Nov. 12, 1999

(30) Foreign Application Priority Data

Nov. 11, 1998 (JP) .................................................. 10-320582

(51) Int. Cl.[7] .................................................. H01L 29/788
(52) U.S. Cl. .......................... 257/665; 257/209; 257/299; 257/304; 257/311
(58) Field of Search .................................. 257/665, 209, 257/299, 304, 311

(56) References Cited

FOREIGN PATENT DOCUMENTS

| | | |
|---|---|---|
| 61-168242 | 7/1986 | (JP) . |
| 63-127549 | 5/1988 | (JP) . |
| 63-198354 | 8/1988 | (JP) . |
| 5-136271 | 6/1993 | (JP) . |
| 6-310603 | 11/1994 | (JP) . |
| 9-17872 | 1/1997 | (JP) . |

*Primary Examiner*—Fetsum Abraham
*Assistant Examiner*—Ahmed N. Sefer
(74) *Attorney, Agent, or Firm*—Young & Thompson

(57) ABSTRACT

A semiconductor memory device has a redundancy function using a fuse block arranged in a window. The fuse block includes a plurality of fuse elements selectively cut by a laser beam in the window for decoding the input address of a defective memory cell. Each fuse element has a pair of parallel lead sections, and a bridge section bridging the ends of the lead sections and disposed for laser cutting. The longer sides of the window can be reduced in size for reduction of the occupied area for the pitch of signal lines and thus the chip area.

8 Claims, 6 Drawing Sheets

REDUNDANCY FUSE BLOCK HAVING A SMALL OCCUPIED AREA

BACKGROUND OF THE INVENTION (a) Field of the Invention

The present invention relates to a redundancy fuse block having a small occupied area and, more particularly, to a redundancy fuse block for use in a semiconductor memory device, such as DRAM, having a redundancy function.

(b) Description of a Related Art

A semiconductor memory device such as DRAM generally has a redundancy function, wherein a row (or column) of memory cells including one or more of defective memory cells is replaced by a redundancy row (column) including redundancy cells in number corresponding to the number of the memory cells to be replaced. If it is found that a memory device has a defective memory cell in a product test, the address of the defective row is stored in a redundancy circuit by selectively cutting a plurality fuses in a fuse block by a laser beam. Each pair of fuse elements in the fuse block represents a bit of row address by the on- or off-states of the fuse elements.

In operation of the semiconductor memory device, if the redundancy decoder detects that an input row address coincides with the address of the replaced row, the input row address is replaced with the redundancy row address by switching the input row address, whereby the defective row is replaced by the redundancy row.

FIG. 1 shows a conventional semiconductor device having a fuse block including fuse elements 33, made of polycrystalline silicon (polysilicon), in number corresponding to the number of bits of row address. The fuse block is received in a rectangular window 31 having longer sides perpendicular to the extending direction of each elongate fuse element 33. In this example, eight fuse elements 33 are arranged in the direction parallel to the longer sides of the rectangular window 31 with a specified space disposed between each two of the fuse elements 33. Both ends of each fuse element 33 are connected to signal lines 34 and 36 made of aluminum at the contacts 35 and 37 disposed outside the window 31. The fuse elements 33 are to be selectively cut by the laser beam within the window 31, for detecting a defective row address in the redundancy address decoder.

During cutting the fuse element 33, the laser beam is irradiated within a circular area "A" receiving therein the bridge section 33a of the single fuse element 33, whereby the specified fuse element 33 is cut at the bridge section 33a without cutting the adjacent fuse elements 33.

In the arrangement of the fuse elements 33, the circular area "A" for assuring a sufficient space between each two of the fuse elements 33 provides safe cutting of a specified fuse element 33 without miss-cutting of the adjacent fuse elements. However, the sufficient space for the fuse elements 33 enlarges the pitch of the signal lines 34 and 36 and associated transistors (not shown), thereby enlarging the overall chip size for the semiconductor device.

Patent Publication JP-A-6-310603 describes a fuse block having a reduced occupied area, such as shown in FIG. 2, wherein two out of three fuse elements 33 have parallel offsets therein. A first pair of fuse elements 33 shown at the left side, fore example, of the window 31 have right-wise offsets, whereas second pair of fuse elements 33 disposed adjacent to the first pair of fuse elements 33, with a straight fuse element 33 sandwiched between the pairs, have leftwise offsets. By deviating the circular areas "A" of the pair of fuse elements 33 from each other in the direction of the elongate fuses 33, the longer sides of the window 31 are reduced in length with the shorter sides being somewhat increased,. The circular area "A" has a radius of 3.5 micrometers ($\mu$m), for example.

In the fuse block described in the publication, however, the advantage in reduction of the area for the window 31 is relatively limited, wherein the longer sides of the window 31 may be reduced from 35 $\mu$m to 29 $\mu$m, for example.

SUMMARY OF THE INVENTION

In view of the above, it is an object of the present invention to provide a window for a fuse block having a reduced occupied area while assuring safe selective-cutting of the fuse elements received therein.

The present invention provides a semiconductor device including a plurality of signal lines and a plurality of associated fuse elements arranged in a window for selectively cutting the fuse elements for a redundancy function of the semiconductor device, each of the fuse elements including a pair of lead sections extending parallel to each other, each of the lead sections having a first end connected to a corresponding one of the signal lines and a second end, and a bridge section connected between the second ends of the pair of lead sections.

In accordance with the semiconductor device of the present invention, since two out of the bridge sections of the fuse elements can be arranged adjacent to each other in the direction of the shorter sides of the window while assuring a sufficient space therebetween, the longer sides of the window receiving therein the fuse elements can be reduced while assuring a safe selective-cutting of the fuse elements.

The above and other objects, features and advantages of the present invention will be more apparent from the following description, referring to the accompanying drawings.

PREFERRED EMBODIMENTS OF THE INVENTION

Figure 1:
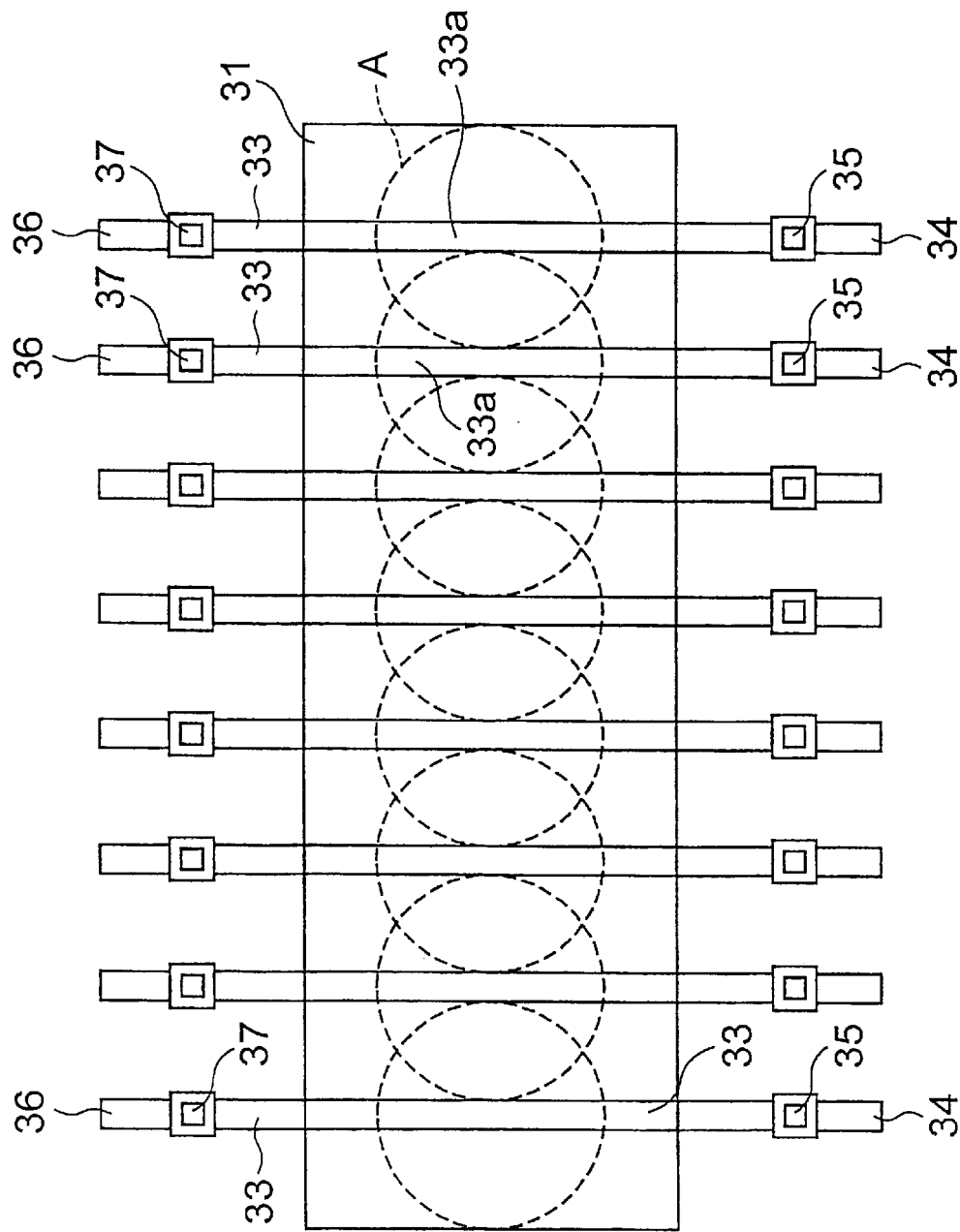
FIG. 1 is a top plan view of a fuse block in a conventional semiconductor device.
Figure 2:
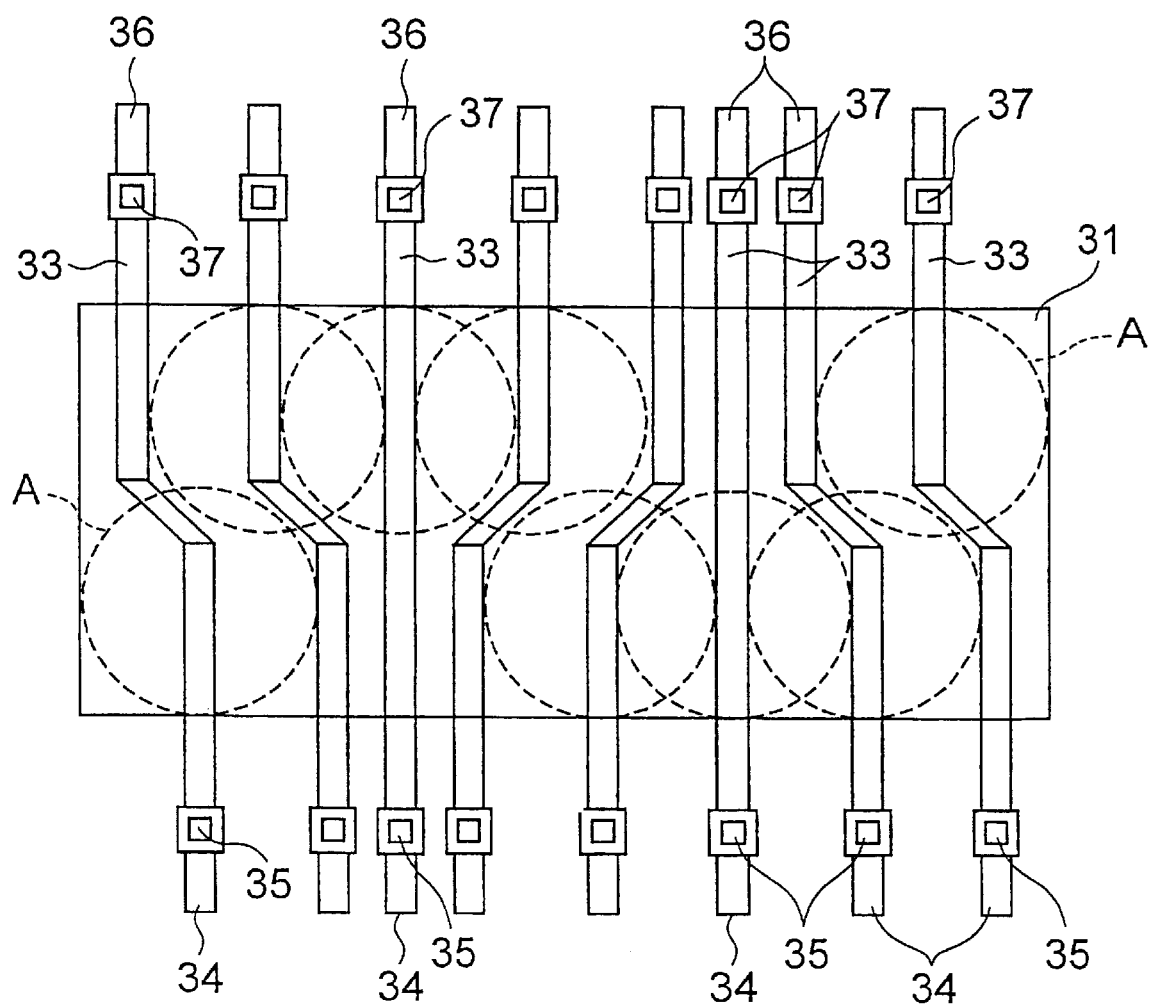
FIG. 2 is a top plan view of a fuse block in another conventional semiconductor device.

Now, the present invention is more specifically described with reference to accompanying drawings, wherein similar constituent elements are designated by similar reference numerals.

Figure 3:
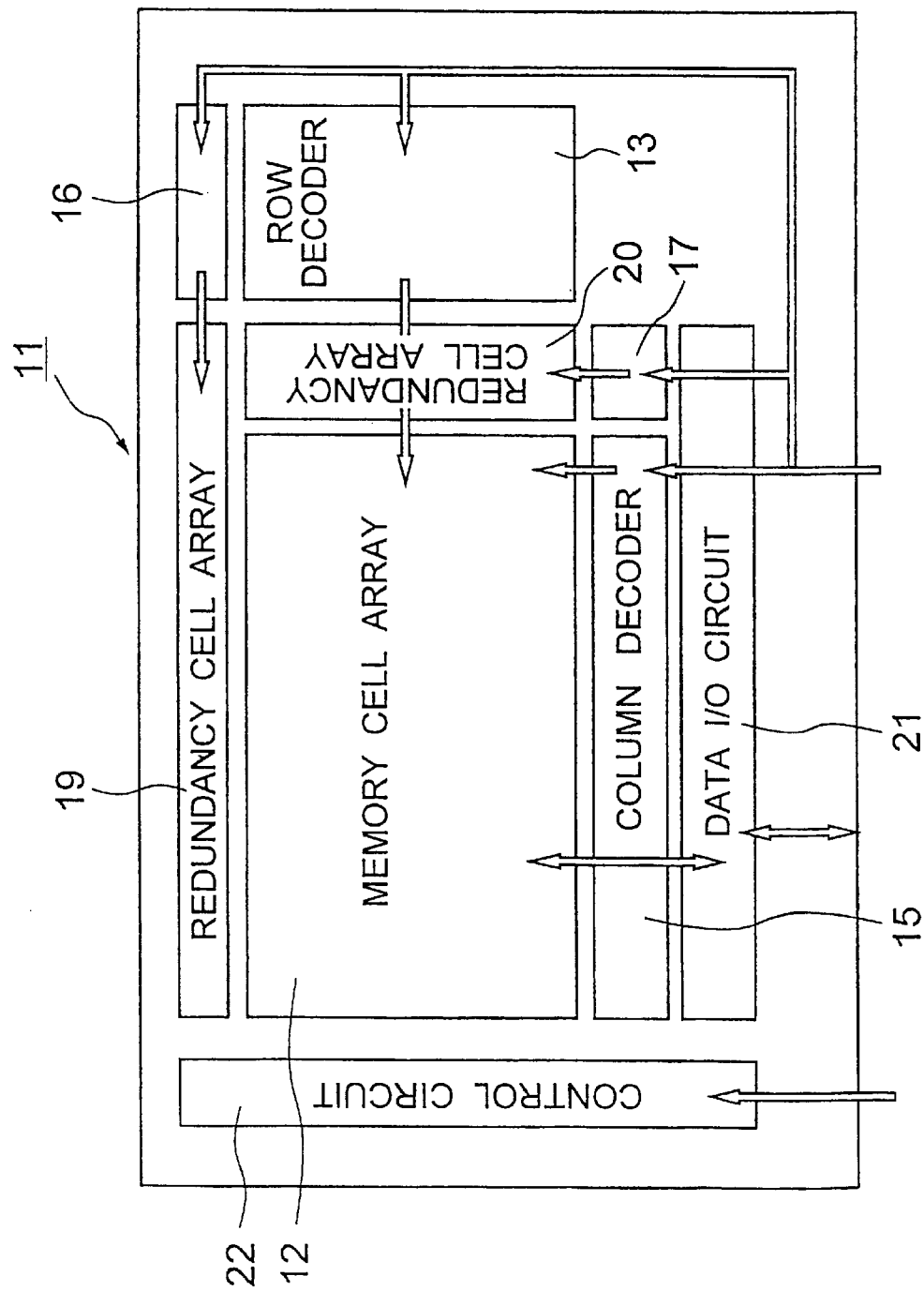
FIG. 3 is a top plan view of a semiconductor memory device having a redundancy function using redundancy fuse elements according to the present invention.

Referring to FIG. 3, a semiconductor memory device 11 having a redundancy function uses fuse elements according to the present invention.

The semiconductor memory device 11 includes a memory cell array 12 including a plurality of memory cells arranged in a matrix, a row address decoder 13 and a column address decoder 15 for decoding an input address to select one of the memory cells in the memory cell array 12, a redundancy cell arrays 19 and 20 each including a plurality of redundancy rows or columns of redundancy cells, redundancy address decoders 16 and 17 each for decoding the input address to select a redundancy row or redundancy column in the redundancy cell arrays 19 and 20 in the case of a defective address being input, a data input/output circuit 21 for executing input/output of the cell data, and a control circuit 22 for controlling the circuit blocks in the memory device 11 based on the input control signals. Each of the redundancy address decoders 16 and 20 has therein a redundancy circuit having a function of detecting a defective row address or defective column address. The redundancy circuit includes a fuse block for each of the columns or rows of the redundancy cell arrays 15 and 19. The defective address is stored in the redundancy circuit by the selective-cutting of the fuse elements executed after a product test of the memory device.

Figure 4:
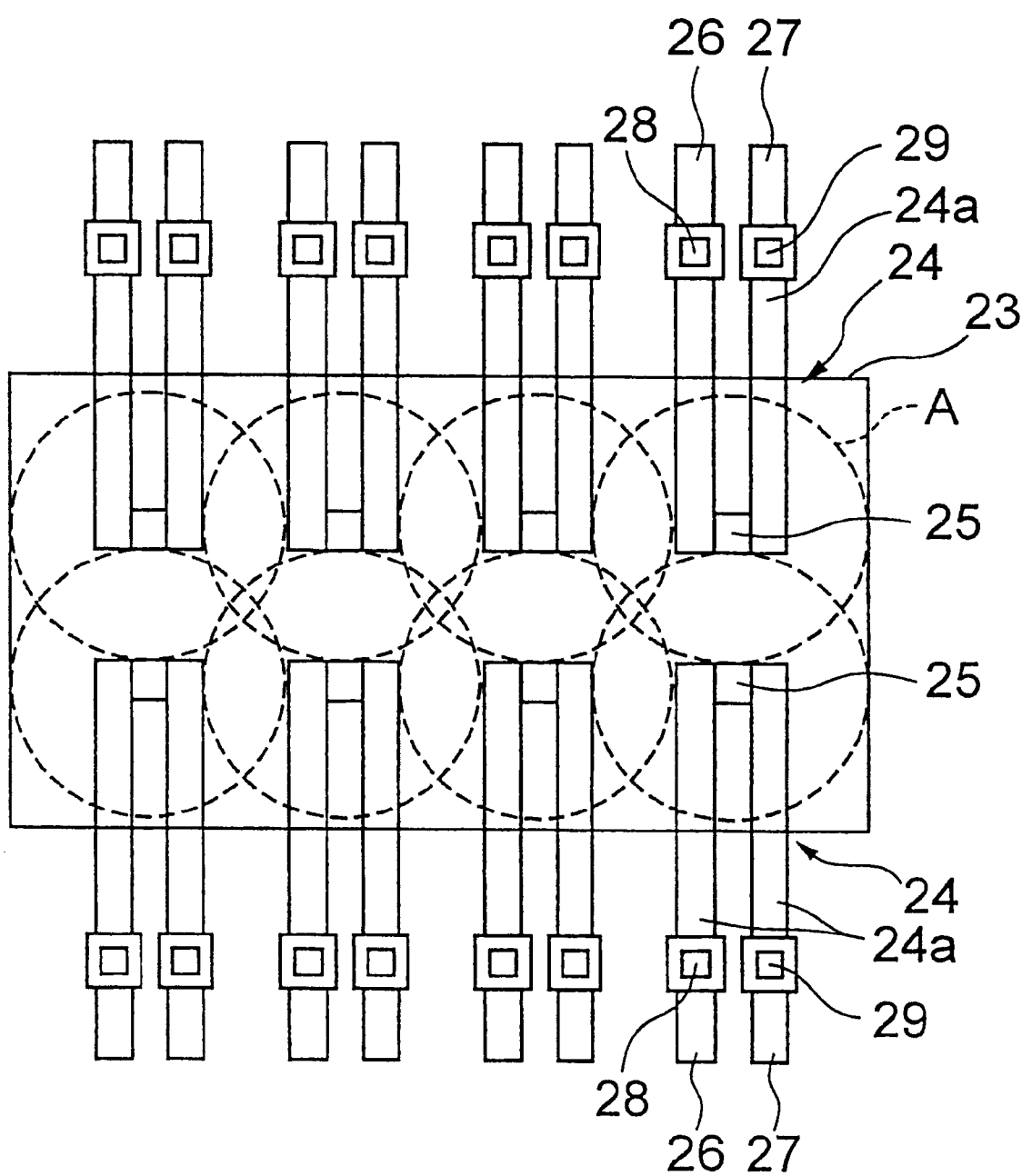
FIG. 4 is a top plan view of the fuse block according to a first embodiment of the present invention.

Referring to FIG. 4 showing the fuse block included in the redundancy circuit of the redundancy address decoder 16 or 20 shown in FIG. 3, the fuse block includes eight fuse elements 23 made of polysilicon and arranged in a matrix of 2×4 in a window 23 corresponding to four bits of the row address or column address. Each fuse element 24 includes a pair of lead sections 24a extending parallel to each other and a single bridge section 25 connected between the ends of respective lead sections 24a. The other ends of the lead sections 24a are connected to respective ends of a pair of signal lines 26 and 27 at terminals 28 and 29. By this configuration, each pair of signal lines 26 and 27 extending parallel to each other are connected to the fuse element 24 to form a single signal path for passing a signal.

A pair of bridge sections 25 disposed adjacent to each other in the direction of the shorter sides of the window 23 extend parallel to each other. Four bridge sections 25 are arranged in a row in the direction of the longer sides of the window 23. Each fuse element 24 is associated with a circular area "A" for cutting the bridge section 25 of the fuse element 24 by a laser beam without cutting the bridge section 25 of the adjacent fuse elements 24, the circular area "A" having the center thereof at the center of the bridge section 25. In other words, the fuse elements 24 are disposed apart from one another so that the circular area "A" for one of the fuse elements 24 does not cover the other fuse elements 24. This arrangement provides a smaller area for the window 23 per fuse element 24.

Assuming that the circular area "A" has a radius of 3.5 μm with the width and the space of the signal lines 26 and 27 as well as the lead sections 24a being 1 μm, the space between the lead sections 24a of adjacent fuse elements 24 in the direction of the longer sides of the window 23 is 2 μm, whereby the pitch of the fuse elements 24 is 5 μm. Thus, the window 23 for the fuse block including eight fuse elements 24 has a longer side of 22 μm, compared to the longer side of the conventional window of 35 μm or 29 μm. The shorter sides of the window 23 is 11 μm in this case.

In fabrication of the semiconductor memory device of the present embodiment, the fuse elements 24 including the bridge section 24a are formed along with the gate electrodes of MOSFETs from polysilicon. After a memory test detects a defective memory cell, the fuse elements are selectively cut by a laser beam irradiating the center of the bridge section 25.

Figure 5:
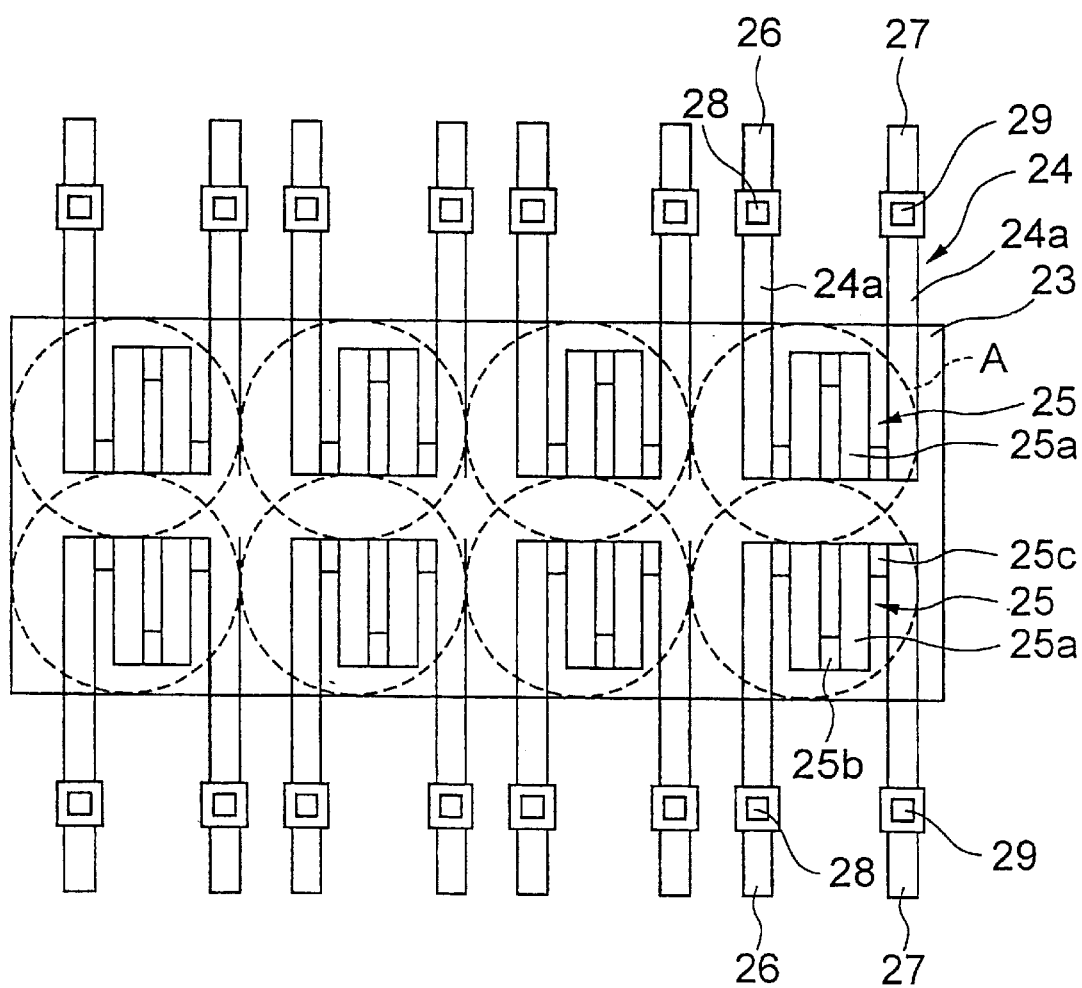
FIG. 5 is a top plan view of the fuse block according to a second embodiment of the present invention.

Referring to FIG. 5, a fuse block in a semiconductor device according to a second embodiment of the present invention includes also eight fuse elements 24. The fuse elements 24 are arranged in a matrix of 2×4, similarly to the first embodiment. Each fuse element 24 has a pair of lead sections 24a, and a single bridge section 25 which includes a pair of switchback sections 25a connected to each other at one ends thereof through a central sub-bridge 25b and also connected to respective ends of the pair of lead sections 25a at the other ends thereof through respective peripheral sub-bridges 25b. In other words, the bride section 25 has four offsets of 90°, which are bent, for example, in counter-clockwise direction, clockwise direction, clockwise direction and counter-clockwise direction. Other configurations are similar to the first embodiment.

The configuration of the fuse element 24 in the present embodiment provides a margin for the area of laser cutting in the direction parallel to the lead sections 24a. Thus, is even if radiation of the laser beam is deviated from the center of the bridge section 25, it is assured that the specified fuse element 24 is cut without cutting adjacent fuse elements 24.

Figure 6:
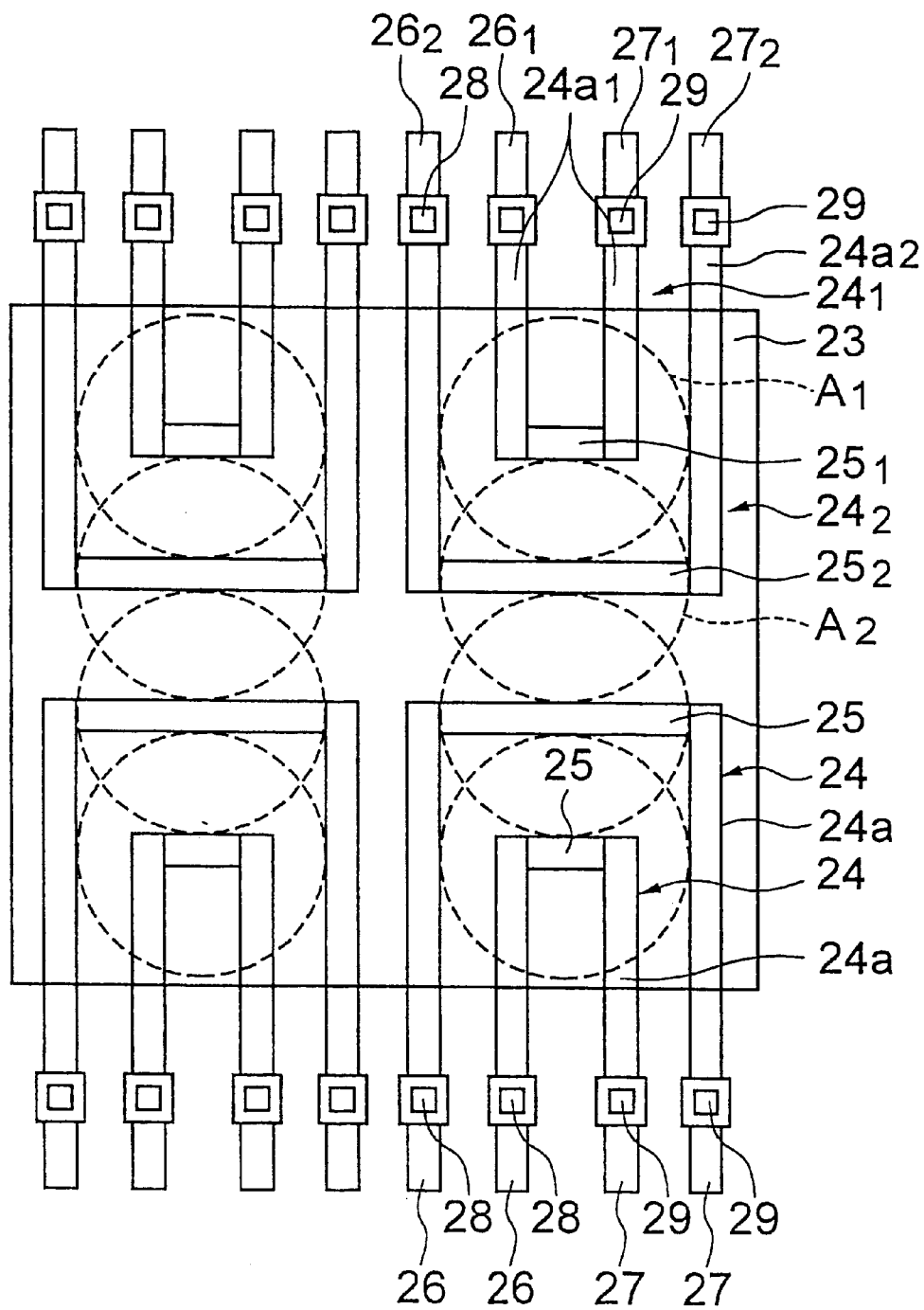
FIG. 6 is a top plan view of the fuse block according to a third embodiment of the present invention.

Referring to FIG. 6, a fuse block including eight fuse elements according to a third embodiment of the present invention is received in a window 23 having a substantially square area. Although each fuse element 24 has a pair of lead sections 24a and a single bridge section 25, similarly to the first embodiment, a pair of fuse elements $24_1$ and $24_2$ are arranged so that one of the pair (first fuse element $24_1$) extends along the inner periphery of the other of the pair (second fuse element $24_2$).

More specifically, the second fuse element $24_2$ has a pair of lead sections $24a_2$ which are longer than the lead sections $24a_1$ of the first fuse element $24_1$ and a bridge section $25_2$ which is longer than the bridge section $25_1$ of the first fuse element $24_1$. The pair of signal lines (and lead sections) $26_2$ and $27_2$ for the second fuse elements $24_2$ sandwich therebetween the pair of signal lines (lead sections) $26_1$ and $27_1$ for the first fuse element $24_1$. Thus, the bridge sections 25 of eight fuse elements 24 are arranged in a 4×4 array in the substantially square window 23, thereby reducing the longer sides of the window 23 extending in the direction perpendicular to the lead sections 24a.

In the above configuration of the fuse block, the bridge sections 25 of each pair of fuse elements 24 can be arranged sufficiently apart from the bridge sections 25 of the other pairs of fuse elements 24 without increasing the space between the associated signal lines 26 and 27.

By the configurations of the above embodiments, the occupied area of the semiconductor memory device can be reduced due to the reduction of the occupied area of the window for the fuse blocks, and due to the reduced space for the associated signal lines and transistors. In addition, by reducing the occupied area of each window, the area for a plurality of windows in the redundancy decoder can be reduced, which affords reduction of radiation area by the laser beam. This provides a higher through-put of the laser-beam cutting. Moreover, the reduced occupied area for the windows affords reduction of the area for the opening in the overcoat film of the semiconductor chip through which laser beam is irradiated, which prevents water or moisture from entering the semiconductor chip.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a plurality of signal lines and a plurality of associated fuse elements arranged in a window for selectively cutting the fuse elements for a redundancy function of said semiconductor device, each of said fuse elements including a pair of lead sections extending parallel to each other, each of said lead sections having a first end connected to a corresponding one of said signal lines and a second end, and a bridge section connected between said second ends of said pair of lead sections.

2. The semiconductor device as defined in claim 1, wherein said bridge sections have a common length in said window.

3. The semiconductor device as defined in claim 2, wherein said lead sections have a common length in said window.

4. The semiconductor device as defined in claim 3, wherein said bridge sections are arranged in two rows in said window.

5. The semiconductor device as defined in claim 1, wherein said bridge section includes a pair of switchback sections connected together through a sub-bridge.

6. The semiconductor device as defined in claim 1, wherein a pair of said fuse elements are arranged so that one of said pair extends inner periphery of the other of said pair.

7. The semiconductor device as defined in claim 1, wherein said fuse elements include polycrystalline silicon and said signal lines include a metal.

8. The semiconductor device as defined in claim 1, wherein said semiconductor device includes a memory device having said redundancy function.

* * * * *